United States Patent
Motoya et al.

(10) Patent No.: US 12,044,911 B2
(45) Date of Patent: Jul. 23, 2024

(54) OPTICAL WAVEGUIDE ELEMENT AND OPTICAL WAVEGUIDE DEVICE

(71) Applicant: SUMITOMO OSAKA CEMENT CO., LTD., Tokyo (JP)

(72) Inventors: Masayuki Motoya, Tokyo (JP); Norikazu Miyazaki, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 336 days.

(21) Appl. No.: 17/599,717

(22) PCT Filed: Sep. 26, 2019

(86) PCT No.: PCT/JP2019/037940
§ 371 (c)(1),
(2) Date: Sep. 29, 2021

(87) PCT Pub. No.: WO2020/202609
PCT Pub. Date: Oct. 8, 2020

(65) Prior Publication Data
US 2022/0057661 A1    Feb. 24, 2022

(30) Foreign Application Priority Data

Mar. 29, 2019  (JP) .................. 2019-067619

(51) Int. Cl.
*G02F 1/035*  (2006.01)
(52) U.S. Cl.
CPC .................. *G02F 1/0356* (2013.01)
(58) Field of Classification Search
CPC .......................................... G02F 1/0356
See application file for complete search history.

(56) References Cited

U.S. PATENT DOCUMENTS

2002/0048076 A1\* 4/2002 Kondo ................. G02F 1/0356
                                                         359/322
2004/0184693 A1\* 9/2004 Stegmuller ...... H04B 10/25752
                                                         385/2

FOREIGN PATENT DOCUMENTS

JP    2002-040381    2/2002
JP    2003-233044    8/2003
(Continued)

OTHER PUBLICATIONS

International Search Report dated Oct. 21, 2019, Application No. PCT/JP2019/037940, English translation Included, 4 pages.

*Primary Examiner* — Tina M Wong
(74) *Attorney, Agent, or Firm* — Rankin, Hill & Clark LLP

(57) ABSTRACT

In an optical modulation element using a thinly processed substrate, cracking of the substrate during electrical connection is prevented, and poor connection or a reduction in manufacturing yield is prevented. An optical waveguide element includes an optical substrate on which an optical waveguide and a conductor pattern are formed, and a support substrate that supports the optical substrate, in which the conductor pattern includes at least one electrical connection area defined as a range in which electrical connection is performed, the optical substrate has a substrate removal portion in which a material of the optical substrate has been removed to penetrate through the optical substrate at a portion corresponding to the electrical connection area, and at least a part of the electrical connection area is formed on the support substrate via the substrate removal portion.

18 Claims, 11 Drawing Sheets

(56) References Cited

FOREIGN PATENT DOCUMENTS

| JP | 2005-274889 | 10/2005 |
|----|-------------|---------|
| JP | 2011-75917  | 4/2011  |

\* cited by examiner

DETAILS OF A PORTION

SECTIONAL VIEW TAKEN ALONG LINE aa

DETAILS OF B PORTION

SECTIONAL VIEW TAKEN ALONG LINE bb

DETAILS OF C PORTION

SECTIONAL VIEW TAKEN ALONG LINE cc

OPTICAL WAVEGUIDE ELEMENT AND OPTICAL WAVEGUIDE DEVICE

TECHNICAL FIELD

The present invention relates to an optical waveguide element and an optical waveguide device.

BACKGROUND ART

In high-speed/large-capacity optical fiber communication systems, optical transmission apparatuses incorporating a waveguide type optical modulator are often used. Above all, an optical modulation element using $LiNbO_3$ (hereinafter, also referred to as LN) having an electro-optic effect for a substrate has less light loss and can realize a wide-band optical modulation characteristic compared with a modulation element using a semiconductor-based material such as indium phosphide (InP), silicon (Si), or gallium arsenide (GaAs), and is thus widely used in high-speed/large-capacity optical fiber communication systems.

On the other hand, in a modulation method in an optical fiber communication system, multi-level modulation such as quadrature phase shift keying (QPSK) or dual polarization-quadrature phase shift keying (DP-QPSK) or transmission formats in which polarization multiplexing is incorporated into the multi-level modulation have become the mainstream in response to the recent trend of increasing transmission capacity.

The acceleration of the spread of Internet services in recent years has led to a further increase in communication traffic, and studies on continuous high-speed and large-capacity optical communication systems are still underway. On the other hand, the demand for miniaturization of the device remains unchanged, and the miniaturization of the optical modulation element is required.

As one measure for miniaturization of the optical modulation element, for example, an optical modulation element using a rib-type waveguide (hereinafter, a rib-type optical modulation element) has been studied (refer to, for example, Patent Literature No. 1). In the rib-type waveguide, a substrate using LN is thinly processed, and other portions are further thinned (for example, to a substrate thickness of 10 μm or less) while leaving a desired striped portion (rib) through dry etching or the like. Therefore, an effective refractive index of the rib portion is made higher than that of the other portions to form an optical waveguide. In the rib-type optical modulation element, compared with the optical modulation element using an optical waveguide manufactured by using metal diffusion of Ti or the like, a light confinement portion is limited to the rib portion, and thus the interaction between light and electricity can be generated efficiently. As a result, a length of an interaction region can be shortened, and thus the optical modulation element can be miniaturized.

However, as a result of the substrate being thinly processed to a thickness of about several tens of microns, a new problem may occur. That is, the optical modulation element needs to be connected to an electric component such as a relay substrate or a connector that relays connection with an external circuit through wire bonding, flip-chip bonding, or the like, for example, inside a housing that houses the optical modulation element. In contrast, in the above-described rib-type optical modulation element, as a result of the substrate being thinly processed to about several tens of microns, peeling or cracking may occur in a substrate due to a pressure or the like applied from a tip of a capillary of a wire bonder or a solder bump when electrical connection such as wire bonding or flip-chip bonding is performed.

That is, an optical modulation element of the related art using a thin substrate such as a rib-type optical modulation element may cause a problem such as a decrease in manufacturing yield due to poor connection with an electric component or the like.

CITATION LIST

Patent Literature

[Patent Literature No. 1] Japanese Laid-open Patent Publication No. 2011-75917

SUMMARY OF INVENTION

Technical Problem

From the above background, in an optical waveguide element using a thinly processed substrate such as a rib-type optical modulation element, it is desirable to prevent substrate cracking at the time of electrical connection and prevent a connection failure and a reduction in manufacturing yield.

Solution to Problem

According to an aspect of the present invention, there is provided an optical waveguide element including an optical substrate on which an optical waveguide and a conductor pattern are formed; and a support substrate that supports the optical substrate, in which the conductor pattern includes at least one electrical connection area defined as a range in which electrical connection is performed, the optical substrate has a substrate removal portion in which a material of the optical substrate has been removed to penetrate through the optical substrate at a portion corresponding to the electrical connection area, and at least a part of the electrical connection area is formed on the support substrate via the substrate removal portion.

According to another aspect of the present invention, a thickness of the optical substrate is 10 μm or less.

According to still another aspect of the present invention, the electrical connection area is a rectangular electrical connection pad configured as a part of the conductor pattern, in which the conductor pattern includes a line portion connected to the electrical connection pad, in which the electrical connection pad is formed to have a width larger than a line width of the line portion close to the electrical connection pad, the width being measured in the same direction as a direction of the line width, and at least a part of the electrical connection pad is formed on the support substrate via the substrate removal portion, and the substrate removal portion is disposed such that its boundary with another portion of the optical substrate is not formed under the line portion.

According to still another aspect of the present invention, the substrate removal portion is formed in a size including at least a circle having a diameter of 40 μm.

According to still another aspect of the present invention, the substrate removal portion is formed to have an opening at an outer edge of the optical substrate.

According to still another aspect of the present invention, the conductor pattern is formed to have a step at a portion corresponding to a boundary between the substrate removal portion and another portion of the optical substrate.

According to still another aspect of the present invention, at least two electrical connection areas are formed on the support substrate via one substrate removal portion.

According to still another aspect of the present invention, the conductor pattern includes a signal conductor pattern through which an electrical signal propagates and a ground conductor pattern that is connected to a ground potential, and the at least two electrical connection areas include the electrical connection area of at least one signal conductor pattern and the electrical connection area of at least one ground conductor pattern.

According to still another aspect of the present invention, the substrate removal portion is formed in a shape in which its boundary with another portion of the optical substrate does not include a bent portion.

According to still another aspect of the present invention, the substrate removal portion is formed to include a portion in which the conductor pattern is not formed in a range of the support substrate that is visually recognizable through the substrate removal portion.

According to still another aspect of the present invention, the electrical connection area is electrically connected to another electrical connection area via a conductor disposed outside the optical substrate.

According to still another aspect of the present invention, there is provided an optical waveguide device including any one of the optical waveguide elements; and a housing that houses the optical waveguide element.

It should be noted that this specification includes all the content of the Japanese Patent Application No. 2019-067619 filed on Mar. 29, 2019.

Advantageous Effects of Invention

According to the present invention, in an optical waveguide element using a thinly processed substrate such as a rib-type optical modulation element, it is possible to prevent substrate cracking at the time of electrical connection such as wire bonding in which a pressure is applied to the substrate and thus to prevent a connection failure and a reduction in manufacturing yield.

DESCRIPTION OF EMBODIMENTS

Hereinafter, embodiments of the present invention will be described with reference to the drawings. An optical waveguide element according to the embodiments described below is an optical modulation element configured by using an LN substrate, but the optical waveguide element according to the present invention is not limited to this. The present invention can be similarly applied to an optical waveguide element having an electrode using a substrate having an electro-optic effect, a thermo-optic effect, and an acoustic-optic effect in addition to the LN substrate, and an optical waveguide element having a function other than optical modulation.

Figure 1:
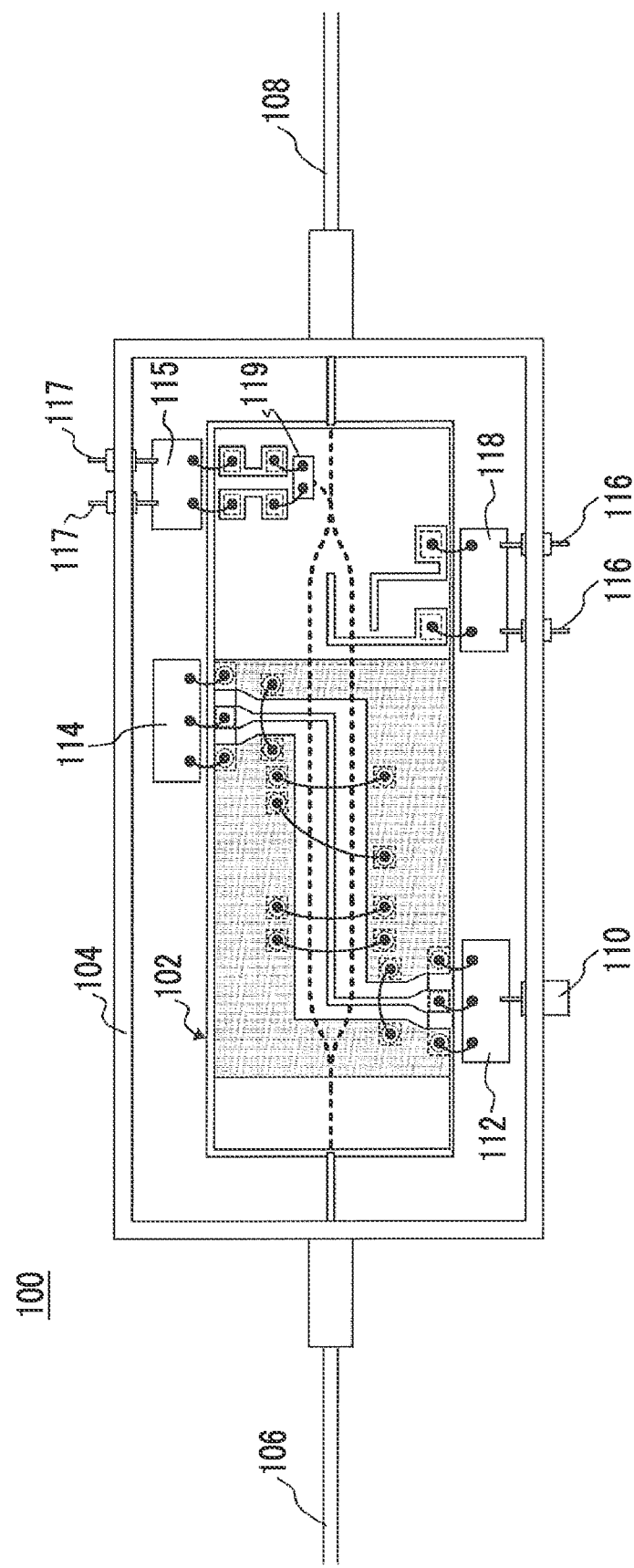
FIG. 1 is a diagram illustrating a configuration of an optical modulation device according to an embodiment of the present invention.

FIG. 1 is a diagram illustrating a configuration of an optical waveguide element and an optical waveguide device according to an embodiment of the present invention. In the present embodiment, the optical waveguide element is an optical modulation element 102 that performs optical modulation by using a Mach-Zehnder optical waveguide, and the optical waveguide device is an optical modulation device 100 that uses the optical modulation element 102.

The optical modulation device 100 houses the optical modulation element 102 inside a housing 104. A cover (not illustrated) which is a plate body is finally fixed to an opening of the housing 104, and the inside of the housing 104 is airtightly sealed.

The optical modulation device 100 further includes an input optical fiber 106 for inputting light into the housing 104, and an output optical fiber 108 for guiding light modulated by the optical modulation element 102 to the outside of the housing 104.

The optical modulation device 100 also has a connector 110 for receiving a high-frequency electrical signal for causing the optical modulation element 102 to perform an optical modulation operation from the outside, and a relay substrate 112 for relaying the high-frequency electrical signal received by the connector 110 to one end of a signal electrode of the optical modulation element 102. The optical modulation device 100 includes a terminator 114 connected to the other end of the signal electrode of the optical modulation element 102 and having a predetermined impedance in order to suppress reflection of an electrical signal. Here, the signal electrode of the optical modulation element 102, and the relay substrate 112 and the terminator 114 are electrically connected to each other, for example, through bonding of, a metal wire or the like.

The optical modulation device 100 includes lead pins 116 and 117, and relay substrates 118 and 115. The lead pin 116 inputs a bias voltage applied from the outside of the housing 104 to the conductor patterns 230$d$ and 230$e$ that are bias electrodes provided in the optical modulation element 102 and will be described later via the relay substrate 118. The lead pin 117 outputs a signal detected by a photodetector 119 provided in the optical modulation element 102 to an electronic circuit provided outside the housing 104 via the relay substrate 115. Here, the photodetector 119 is, for example, a photodiode (PD) that receives light branched from an output waveguide of a Mach-Zehnder optical waveguide configuring the optical modulation element 102, and monitors output light of the optical modulation element 102. The lead pins 116 and 117 are, for example, glass terminals.

Figure 2:
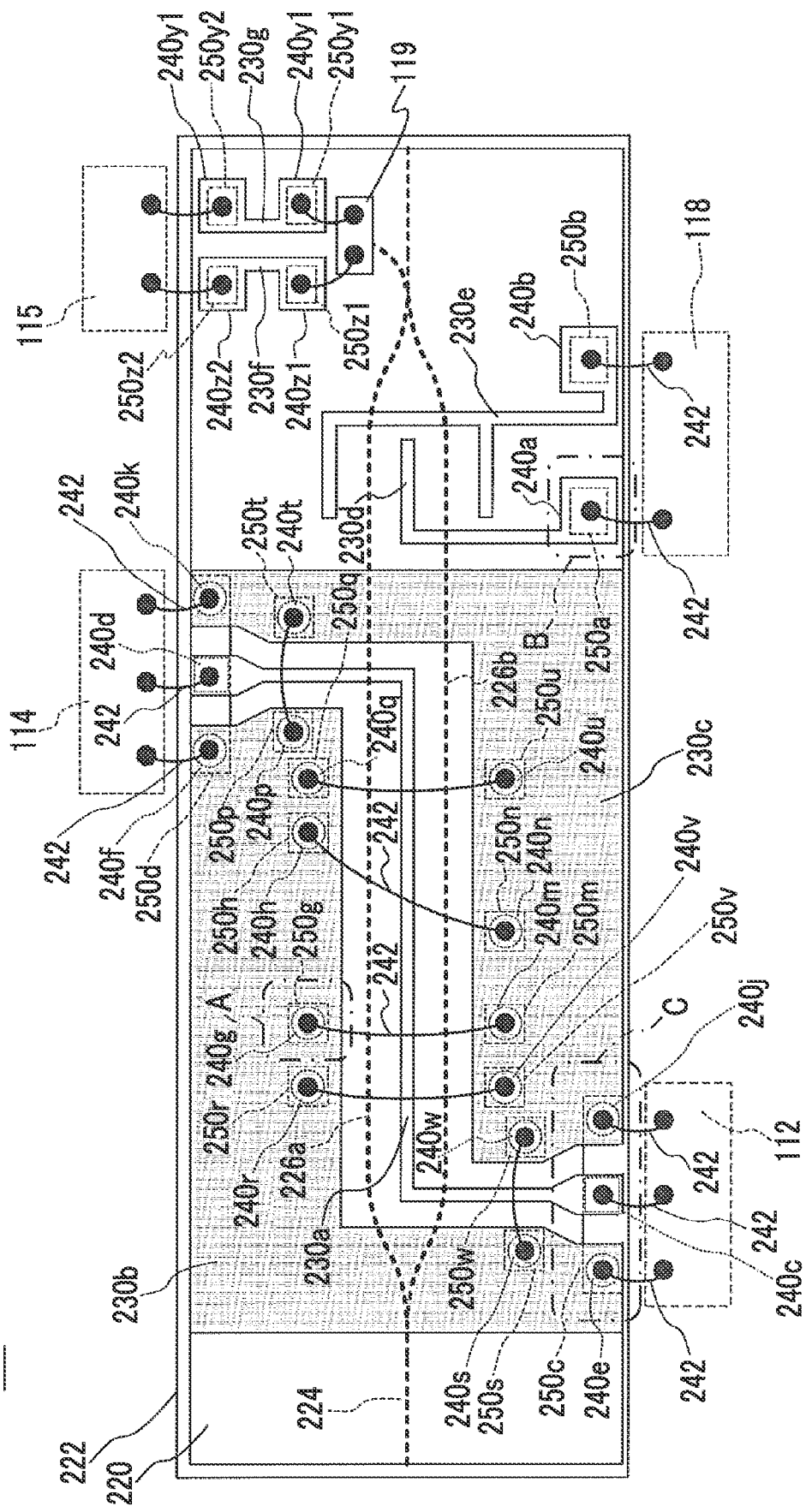
FIG. 2 is a diagram illustrating a configuration of an optical modulation element used in the optical modulation device illustrated in FIG. 1.

FIG. 2 is a diagram illustrating a configuration of the optical modulation element 102 that is an optical waveguide element housed in the housing 104 of the optical modulation device 100 illustrated in FIG. 1.

The optical modulation element 102 includes, for example, an optical substrate 220 made of LN and a support substrate 222 that supports the optical substrate 220. An optical waveguide 224 (a thick dotted line in the figure) is formed on the optical substrate 220. The optical waveguide 224 is, for example, a Mach-Zehnder optical waveguide including two parallel waveguides 226a and 226b. Here, the optical substrate 220 is thinly processed to a thickness of 10 μm or less in the present embodiment, and the optical waveguide 224 is configured as a rib-type optical waveguide. The support substrate 222 is configured to be thicker than the optical substrate 220 such that its mechanical strength is stronger than that of at least the thinly processed optical substrate 220. As the support substrate 222, a substrate made of a material such as quartz, sapphire, or optical glass having a refractive index lower than that of the optical substrate, or a substrate in which a layer having a refractive index lower than that of the optical substrate 220 (SiO2 or the like) is laminated on a surface of a substrate such as Si or LN having a refractive index equal to or higher than that of the optical substrate 220 is used such that a rib-type optical waveguide structure is formed.

Conductor patterns 230a, 230b, 230c, 230d, 230e, 230f, and 230g (hereinafter, also collectively referred to as conductor pattern 230) are formed on the optical substrate 220. The conductor pattern 230 configures an electrode for controlling an optical wave propagating in the optical waveguide 224. Specifically, the conductor patterns 230a, 230b, and 230c are signal electrodes for changing refractive indexes of the parallel waveguides 226a and 226b according to a high-frequency electrical waveform on the basis of the input high-frequency electrical signal. The conductor pattern 230a is a signal conductor pattern through which an electrical signal propagates, and the conductor patterns 230b and 230c are ground conductor patterns that are connected to the ground potential.

The conductor patterns 230d and 230e are bias electrodes for setting an operating point (reference point) of a refractive index change by the signal electrode according to an input DC voltage. The conductor patterns 230f and 230g are connected to two electrodes of the photodetector 119.

The conductor pattern 230 includes, for example, electrical connection areas 240a, 240b, 240c, 240d, 240e, 240f, 240g, 240h, 240j, 240k, 240m, 240n, 240p, 240q, 240r, 240s, 240t, 240u, 240v, 240w, 240y1, 240y2, 240z1, and 240z2 (hereinafter, also collectively referred to as electrical connection areas 240) that are defined in advance as a range in which electrical connection with a metal wire 242 is performed.

For example, the electrical connection areas 240a, 240b, 240y1, 240y2, 240z1, and 240z2 are so-called electrical connection pads (hereinafter, simply referred to as pads) formed as rectangular conductors forming a part of the conductor patterns 230d, 230e, 230f, 230g, respectively. The electrical connection areas 240c and 240d are rectangular pads (dotted line rectangular portions in the figure) respectively provided at the upper and lower ends of the conductor pattern 230a, and are respectively connected to line portions via transition patterns formed in tapered shape.

For example, the electrical connection areas 240e, 240f, 240g, 240h, 240p, 240q, 240r, and 240s are not configured as conductor pattern portions having a specific shape such as pads, but are defined as a circular range partitioned in a conductor plane forming the wide conductor pattern 230b. Similarly, the electrical connection areas 240j, 240k, 240m, 240n, 240t, 240u, 240v, and 240w are defined as circular range partitioned in a conductor plane forming the conductor pattern 230c.

In particular, in the optical modulation element 102 according to the present embodiment, substrate removal portions 250a, 250b, 250c, 250d, 250g, 250h, 250m, 250n, 250p, 250q, 250r, 250s, 250t, 250u, 250v, 250w, 250y1, 250y2, 250z1, and 250z2 (hereinafter, collectively also referred to as substrate removal portions 250) in which a material of the optical substrate 220 is removed from to penetrate through the optical substrate 220 in the thickness direction are respectively provided at portions of the optical substrate 220 corresponding to the electrical connection areas 240.

Here, the substrate removal portions 250a, 250b, 250g, 250h, 250m, 250n, 250p, 250q, 250r, 250s, 250t, 250u, 250v, 250w, 250y1, 250y2, 250z1, and 250z2 are respectively provided at portions corresponding to the electrical connection areas 240a, 240b, 240g, 240h, 240m, 240n, 240p, 240q, 240r, 240s, 240t, 240u, 240v, 240w, 240y1, 240y2, 240z1, and 240z2. The single substrate removal portion 250c is provided at a portion corresponding to the electrical connection areas 240c, 240e, and 240j arranged side by side on the lower side of the optical modulation element 102 in the figure, and the single substrate removal portion 250d is provided at a portion corresponding to the electrical connection areas 240d, 240e, and 240k arranged side by side on the upper side of the optical modulation element 102 in the figure.

At least apart of each of the electrical connection areas 240 is formed on the support substrate 222 via the corresponding substrate removal portion 250.

Here, in the present embodiment, each of the electrical connection areas 240 is provided as a portion to which a metal wire is bonded through wire bonding such as ball bonding or wedge bonding. Each of the substrate removal portions 250 is formed in a size including a size of a wire bonding portion formed through the wire bonding and a size (contact size) in consideration of the position accuracy of the wire bonding in a plan view. In the present embodiment, the contact size is a circle with a diameter of 40 μm. That is, each of the substrate removal portions 250 is formed in a size including a circle having a diameter of at least 40 μm in a plan view.

The electrical connection area 240 may be connected to electric component (for example, the relay substrates 112 and 118 or the terminator 114) outside the optical substrate 220, and may also be electrically connected to another electrical connection area 240 via a conductor (for example, the metal wire 242) disposed outside the optical substrate 220. For example, the electrical connection areas 240g and 240m, and the electrical connection areas 240h and 240n illustrated in FIG. 2 are respective examples of the electrical connection therebetween.

The optical modulation element 102 having the above configuration is provided with the substrate removal portions 250 that penetrate through the optical substrate 220 at the portions of the optical substrate 220 corresponding to the electrical connection areas 240, and at least some of the electrical connection areas 240 are formed on the support substrate 222 via the substrate removal portions 250. Therefore, for example, when a metal wire is bonded to the electrical connection area 240, for example, the welding pressure applied to the electrical connection area 240 by a capillary of a wire bonder is not applied to the thinly processed optical substrate 220, and is applied to the support substrate 222 via the substrate removal portion 250. Therefore, the optical modulation element 102 can prevent the occurrence of cracks in the optical substrate 220 during electrical connection to the conductor pattern 230 on the optical substrate 220, and can thus prevent a connection failure and a reduction in manufacturing yield.

Figure 3:
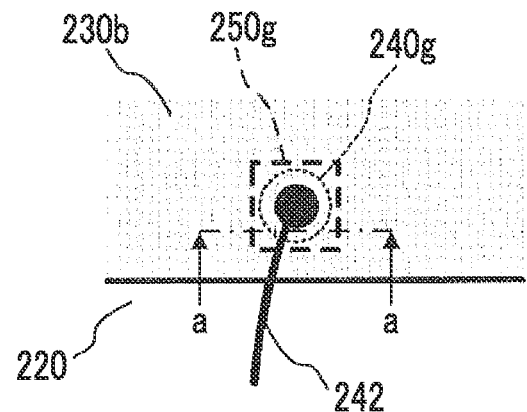
FIG. 3 is a partial detailed view of an A portion of the optical modulation element illustrated in FIG. 2.
Figure 4:
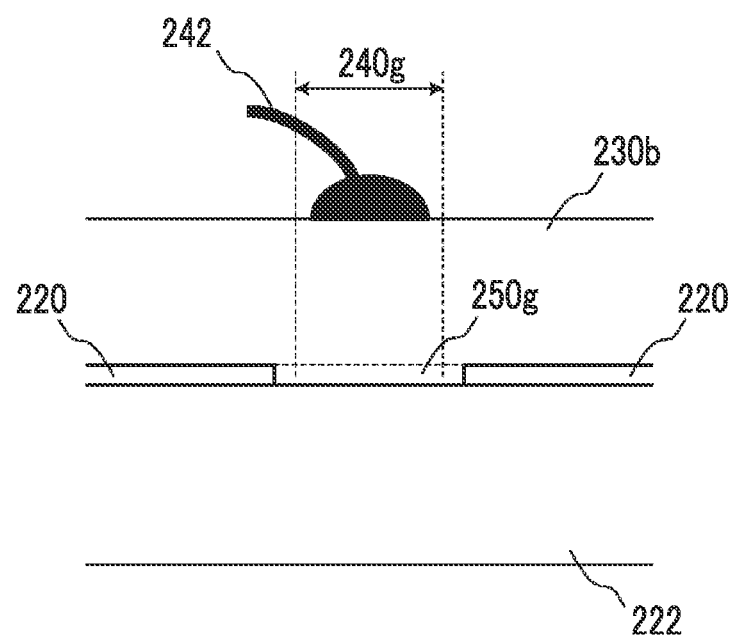
FIG. 4 is a sectional view taken along the line aa in the partial detailed view of FIG. 3.

FIG. 3 is a partial detailed view of an A portion of the optical modulation element 102 illustrated in FIG. 2. FIG. 4 is a sectional view taken along the line aa in the A portion illustrated in FIG. 3. The electrical connection area 240g is provided with a size equal to or larger than the above contact size (a circle with the diameter of 40 μm) set in consideration of bonding position accuracy and the like. The substrate removal portion 250g is provided as a through-hole that penetrates through the optical substrate 220 in the thickness direction. The substrate removal portion 250g is formed in a size including the electrical connection area 240g in a plan view, and thus is formed in a size including at least a circle having the diameter of 40 μm. Within the range of the substrate removal portion 250g, the electrical connection area 240g and its periphery of the conductor pattern 230b are formed on the support substrate 222. The metal wire 242 is bonded in the electrical connection area 240g formed on the support substrate 222. In particular, a conductor thicker than the optical substrate 220 is preferably formed in the vicinity of the conductor pattern in which a high-frequency signal propagates such that the electrical connection area 240g and the pattern therearound are not separated by a step due to the substrate removal portion.

Figure 5:
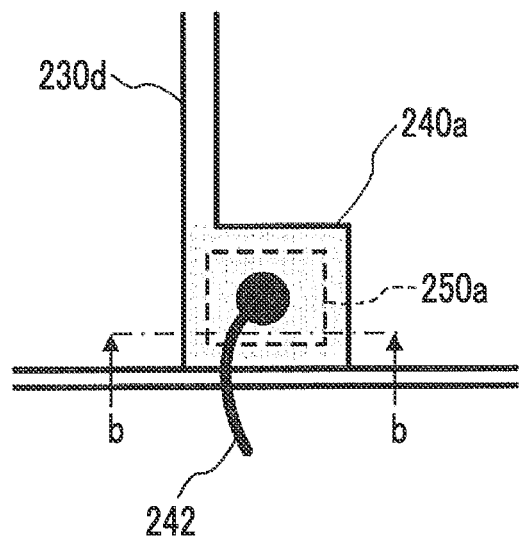
FIG. 5 is a partial detailed view of a B portion of the optical modulation element illustrated in FIG. 2.
Figure 6:
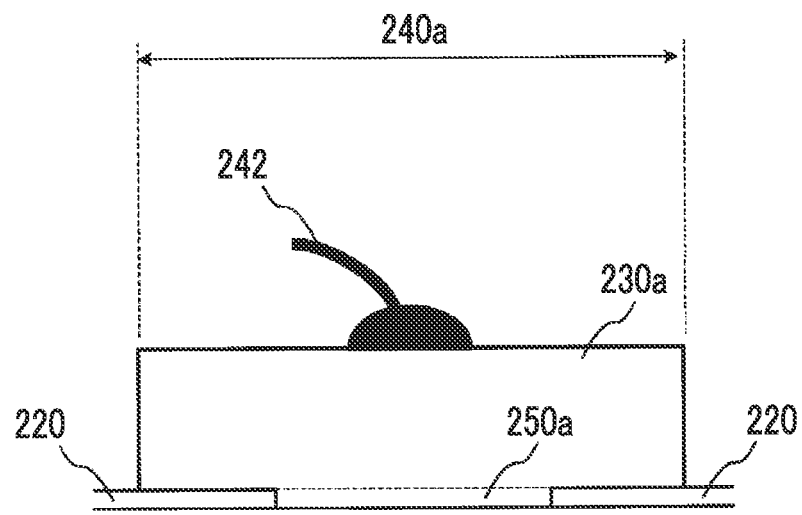
FIG. 6 is a sectional view taken along the line bb in the partial detailed view of FIG. 5.
Figure 6:

FIG. 5 is a partial detailed view of a B portion of the optical modulation element 102 illustrated in FIG. 2. FIG. 5 is a sectional view taken along the line bb in the B portion illustrated in FIG. 6. As described above, the electrical connection area 240a is a so-called pad formed as a rectangular conductor forming a part of the conductor pattern 230d. The substrate removal portion 250a is provided as a through-hole penetrating through the optical substrate 220 in the thickness direction in the same manner as the substrate removal portion 250g described above, and is formed in a size including at least a circle with 40 μm in a plan view.

Within the range of the substrate removal portion 250a, a part of the electrical connection area 240a is formed on the support substrate 222 via the substrate removal portion 250a. The metal wire 242 is bonded to the portion of the electrical connection area 240a formed on the support substrate 222 via the substrate removal portion 250a.

The substrate removal portion 250a may be formed to include the entire pad and thus the entire electrical connection area 240a, depending on a size of the pad forming the electrical connection area 240a and a size of the contact size. In this case, the entire electrical connection area 240a is formed on the support substrate 222 via the substrate removal portion 250a.

That is, as long as a portion of the electrical connection area 240 having a size corresponding to the contact size is formed on the support substrate 222, at least a part of the electrical connection area 240 may be formed on the support substrate 222 via the substrate removal portion 250.

Figure 7:
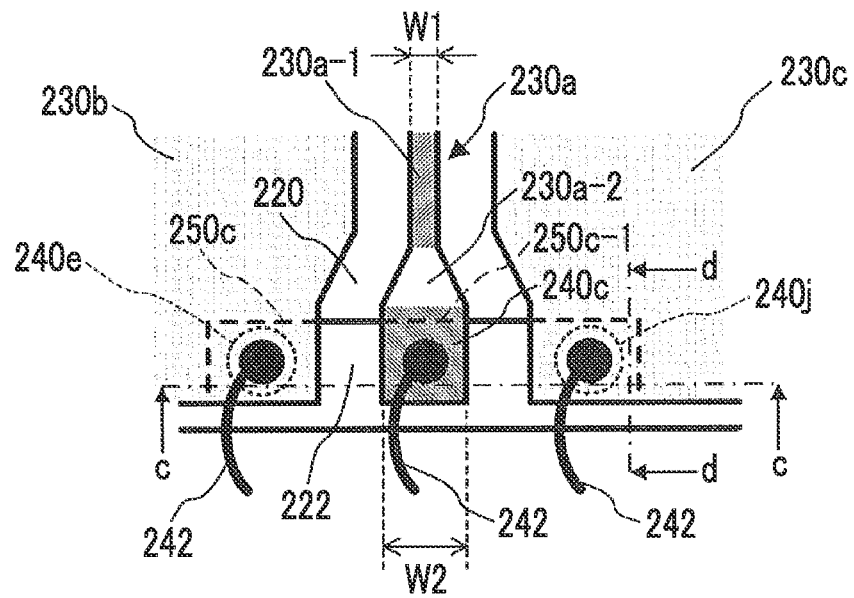
FIG. 7 is a partial detailed view of a C portion of the optical modulation element illustrated in FIG. 2.
Figure 8:
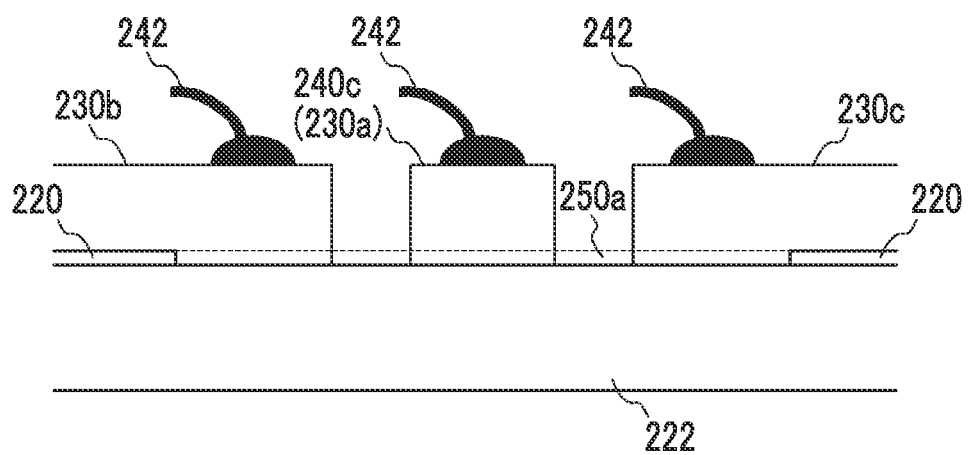
FIG. 8 is a sectional view taken along the line cc in the partial detailed view of FIG. 7.
Figure 9:
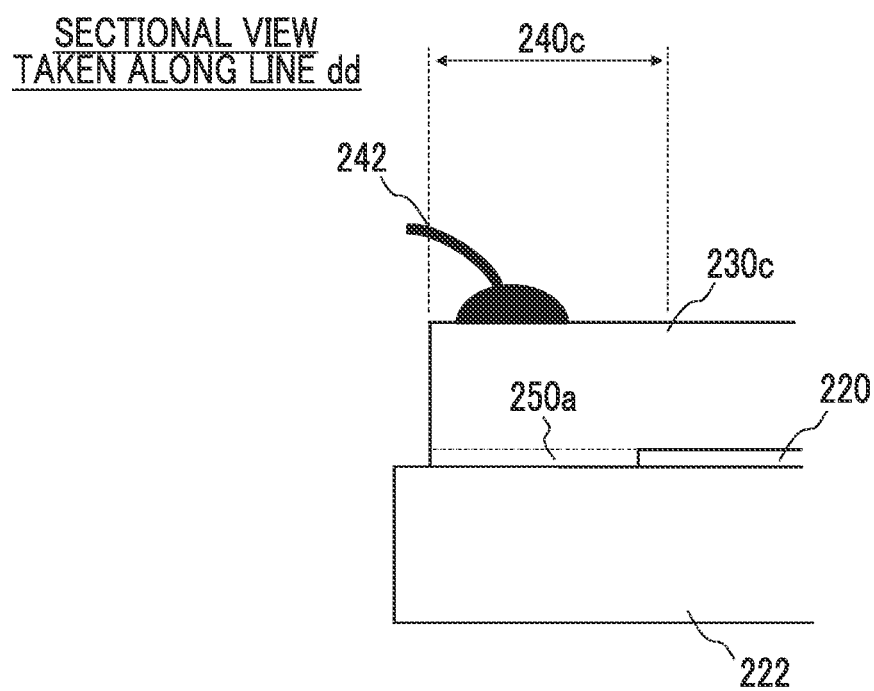
FIG. 9 is a sectional view taken along the line dd in the partial detailed view of FIG. 7.

FIG. 7 is a partial detailed view of a C portion of the optical modulation element 102 illustrated in FIG. 2. FIGS. 8 and 9 are respectively sectional views taken along the line cc and taken along the line dd in the C portion illustrated in FIG. 7. The electrical connection areas 240e and 240j are defined as circular ranges partitioned in the respective conductor planes forming the wide conductor patterns 230b and 230c that are ground conductor patterns, respectively. The electrical connection area 240c is formed as a rectangular pad provided at the lower end of the conductor pattern 230a that is a signal conductor pattern in the figure (in FIG. 7, a rectangular portion hatched with a right diagonal line). These electrical connection areas 240e, 240c, and 240j are arranged side by side in the horizontal direction in the figure in the vicinity of the outer edge of the optical substrate 220 on the lower side in the figure.

The single substrate removal portion 250c is provided for these three electrical connection areas 240e, 240c, and 240j. That is, the substrate removal portion 250c is different from the above-described substrate removal portions 250g and 250a in that the substrate removal portion 250c is provided for the plurality of electrical connection areas 240e, 240c and 240j. The substrate removal portion 250c is configured to penetrate through the optical substrate 220 in the thickness direction in the same manner as the substrate removal portions 250g and 250a described above, but is different from the substrate removal portions 250g and 250a in that the substrate removal portion 250c is configured as a rectangular notch having an opening at the outer edge of the optical substrate 220.

The electrical connection areas 240e and 240j that are partitioned as circles in the conductor planes forming the conductor patterns 230b and 230c are provided to each have a size equal to or larger than the contact size (for example, a circle with the diameter of 40 μm) in the same manner as the above-described electrical connection area 240g. The substrate removal portion 250c is formed to include the electrical connection areas 240e and 240j and thus to include an area having the contact size area included in the electrical connection areas 240e and 240j.

The conductor pattern 230a that is a signal conductor pattern includes a line portion 230a-1 (a portion hatched with a left diagonal line in the figure) connected to the electrical connection area 240c formed as a pad at the end of the conductor pattern 230. The electrical connection area 240c is connected to the line portion 230a-1 via, for example, a transition pattern 230a-2 provided in a shape in which a width direction changes in a tapered shape.

In the electrical connection area 240c provided as the pad, with respect to a line width W1 of the line portion 230a-1 close to the electrical connection area 240c, a width W2 measured in the same direction as the line width is wider than the width W2.

At least a part of the electrical connection area 240c that is the pad is formed on the support substrate 222 via the substrate removal portion 250c. The substrate removal portion 250c is disposed such that a boundary 250c-1 with the other portion of the optical substrate 220 is not formed under the line portion 230a-1, that is, is formed, for example, under a transition pattern 230a-2.

In the configuration of the optical modulation element 102 in the C portion, since the plurality of electrical connection areas 240 are formed on the support substrate 222 via one substrate removal portion 250, the number of through-holes or notches provided in the optical substrate 220 can be reduced. Therefore, processing steps of the optical substrate 220 can be simplified and the cost can be reduced. Since the substrate removal portion 250c is not formed under the line portion 230a-1 of which the boundary 250c-1 is a fine pattern, it is possible to prevent the line portion 230a-1 from being disconnected, having a poor shape, and the like.

In the C portion, one substrate removal portion 250c is provided for the three electrical connection areas 240e, 240c, and 240j, but the present invention is not limited to this. One substrate removal portion 250 may be provided for at least two electrical connection areas 240, and at least a part of each of the at least two electrical connection areas 240 may be formed on the support substrate 222 via the one substrate removal portion.

At least the two electrical connection areas 240 for which one substrate removal portion 250 is provided may include the electrical connection area 240 of the conductor pattern 230 that is at least one signal conductor pattern, and the electrical connection area 240 of the conductor pattern 230 that is at least one ground conductor pattern similarly to the C portion.

According to this configuration, it is possible to prevent cracking or chipping of the optical substrate 220 between the two substrate removal portions 250, which may occur in a case where the two substrate removal portions 250 are provided adjacent to each other separately for two electrical connection areas such as a signal conductor pattern and a ground conductor pattern forming a signal line, which are easily disposed to be arranged in close proximity to each other.

Figure 10:
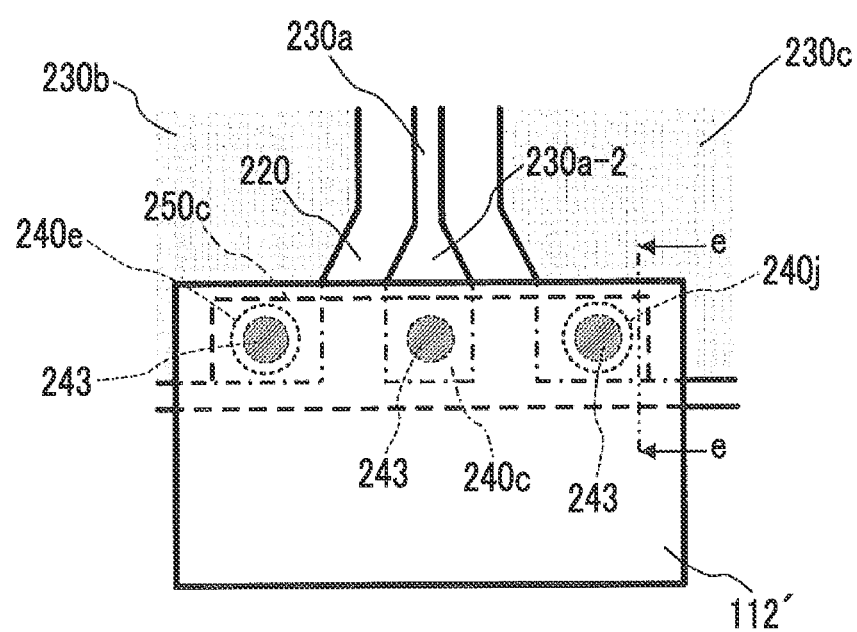
FIG. 10 is a diagram illustrating an example of a configuration in a case where flip-chip bonding is performed on an electrical connection area.

In the present embodiment, the metal wire 242 is connected to the electrical connection area 240, but the present invention is not limited to this. The electrical connection area 240 may be connected via a solder bump, for example, through flip-chip bonding. FIG. 10 is a diagram illustrating an example of a configuration in which the electrical connection area 240 is connected through the flip-chip bonding. FIG. 10 is a diagram corresponding to a detailed view of the C portion in FIG. 7 illustrating connection portions with the electrical connection areas 240e, 240c, and 240j. In FIG. 10, the same constituents as those in FIG. 7 are given the same reference numerals as those in FIG. 7.

Figure 11:
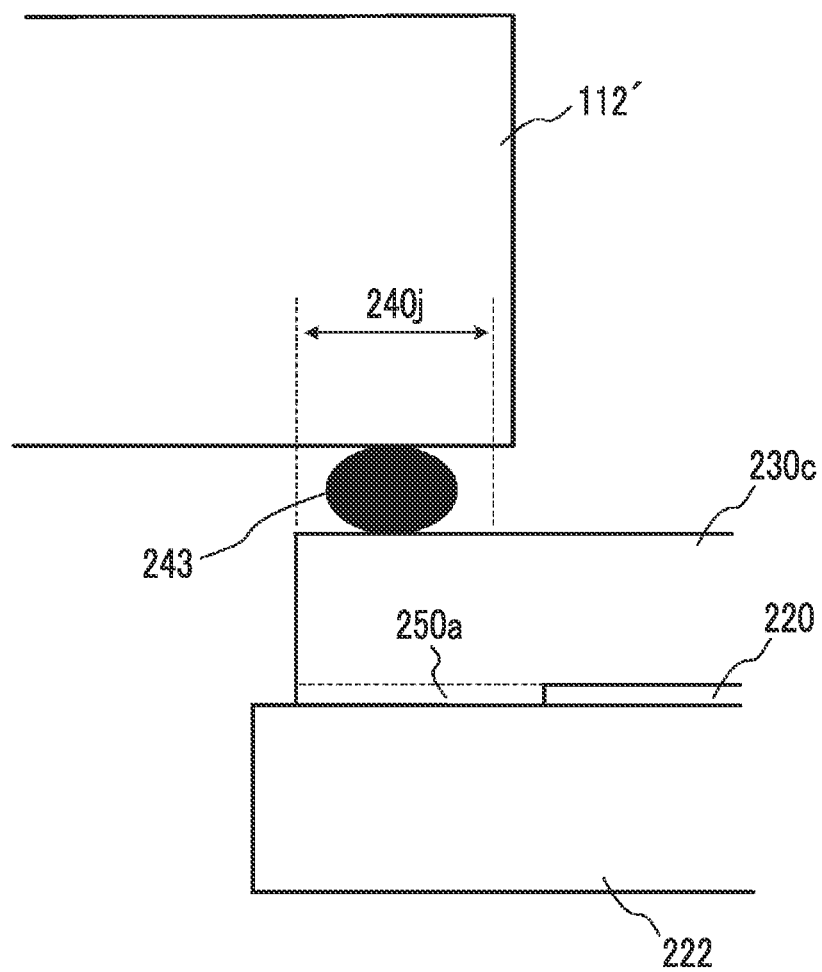
FIG. 11 is a sectional view taken along the line ee in FIG. 10.

In the illustrated example, a relay substrate 112' configured to perform flip-chip bonding is used instead of the relay substrate 112. FIG. 11 is a sectional view taken along the line ee in FIG. 10. In the relay substrate 112', an electrode (not illustrated) provided on a back surface of the relay substrate 112' (a lower surface in FIG. 11) is connected to, for example, the electrode connection area 240j via a solder bump 243. In this configuration, since, during flip-chip bonding, the pressure applied from the relay substrate 112' via the solder bump 243 is applied to the support substrate 222 without being applied to the optical substrate 220, it is possible to prevent the occurrence of damage such as cracking of the optical substrate 220 and thus to prevent poor connection and a reduction in manufacturing yield in the same manner as in the case of performing the connection using the metal wire 242 described above.

Figure 12:
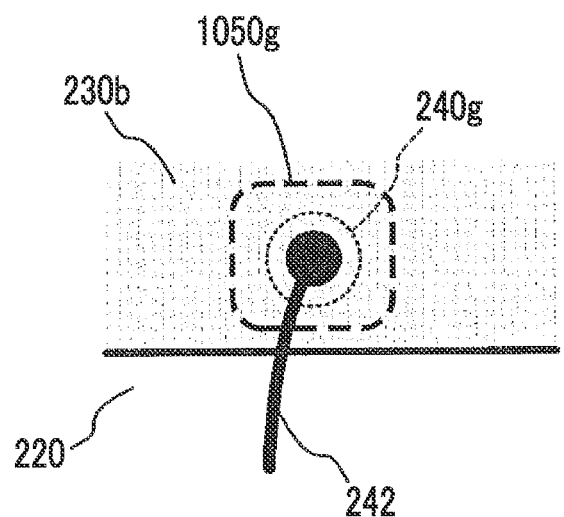
FIG. 12 is a diagram illustrating a first modification example of a substrate removal portion.
Figure 13:
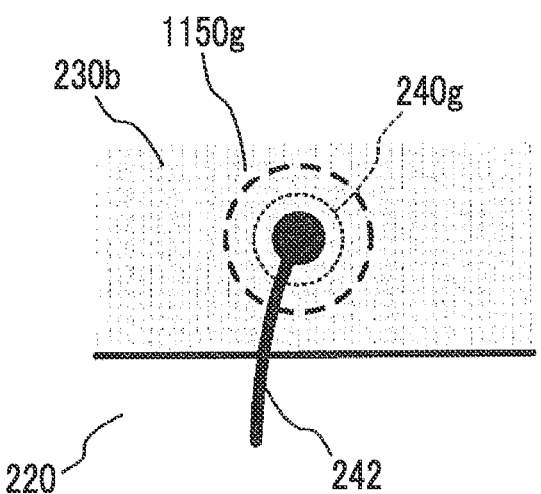
FIG. 13 is a diagram illustrating a second modification example of the substrate removal portion.

A shape of the substrate removal portion, that is, a shape of the boundary between the substrate removal portion and the other portion of the optical substrate 220 is not limited to the rectangular shape illustrated in FIGS. 2, 3, 5, and 7. FIGS. 12 and 13 are diagrams illustrating first and second modification examples of the substrate removal portion 250. FIGS. 12 and 13 are diagrams corresponding to FIG. 3 illustrating the A portion in FIG. 2.

A substrate removal portion 1050g illustrated in FIG. 12 has the same configuration as that of the substrate removal portion 250g, but is different from the substrate removal portion 250g in that bent portions at the four corners of the rectangular shape are curved. A substrate removal portion 1150g illustrated in FIG. 13 has the same configuration as that of the substrate removal portion 250g, but is different from the substrate removal portion 250g in that the substrate removal portion 1150g is formed in a circular shape instead of a rectangular shape. Since these substrate removal portions 1050g and 1150g are formed in a shape (a shape having a continuous curvature without corners) in which the boundary does not include a bent portion on which stress generated due to processing strain, a temperature variation in the manufacturing process, and a variation in the usage environment temperature is likely to concentrate, it is possible to prevent the occurrence of peeling in the optical substrate at the removal portion during the manufacturing process of the optical substrate 220 and improve mechanical stability. A shape of the substrate removal portion is not limited to this, and may be, for example, an elliptical shape or a polygonal shape.

Figure 14:
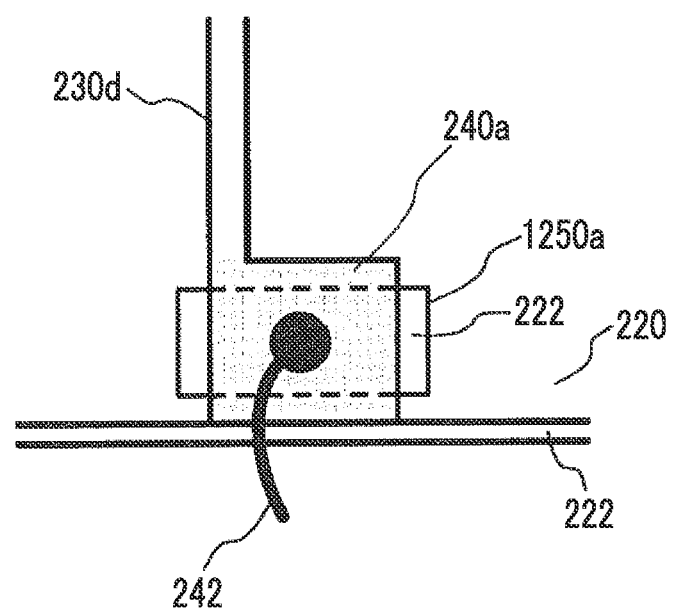
FIG. 14 is a diagram illustrating a third modification example of the substrate removal portion.

The substrate removal portion may be formed to include a portion of the support substrate 222 in which the conductor pattern 230 is not formed in a range on the support substrate 222 that can be visually recognized through the substrate removal portion. FIG. 14 is a diagram illustrating a third modification example of the substrate removal portion 250. FIG. 14 is a diagram corresponding to FIG. 5 illustrating the B portion in FIG. 2. A substrate removal portion 1250a illustrated in FIG. 14 has the same configuration as that of the substrate removal portion 250a, but includes a portion of which a width in the horizontal direction in the figure extends beyond a width of the electrical connection area 240a and in which the electrical connection area 240a is not formed in a range on the support substrate 222 that can be visually recognized through the substrate removal portion 1250a.

As a result, when electrical connection to the electrical connection area 240a is performed, for example, when the metal wire 242 is bonded, a position of the substrate removal portion 250a can be visually recognized, and thus the electrical connection can be performed accurately at a position of a portion of the electrical connection area 240a in the substrate removal portion 250a.

In FIGS. 4, 6, 8, and 9 illustrating the above-described embodiment, the upper surface of the conductor pattern 230 formed on the substrate removal portion 250 is assumed to be flat, but the present invention is not limited to this. The conductor pattern 230 may be formed to have a step at a portion corresponding to the boundary between the substrate removal portion and the other portion of the optical substrate 220.

Figure 15:
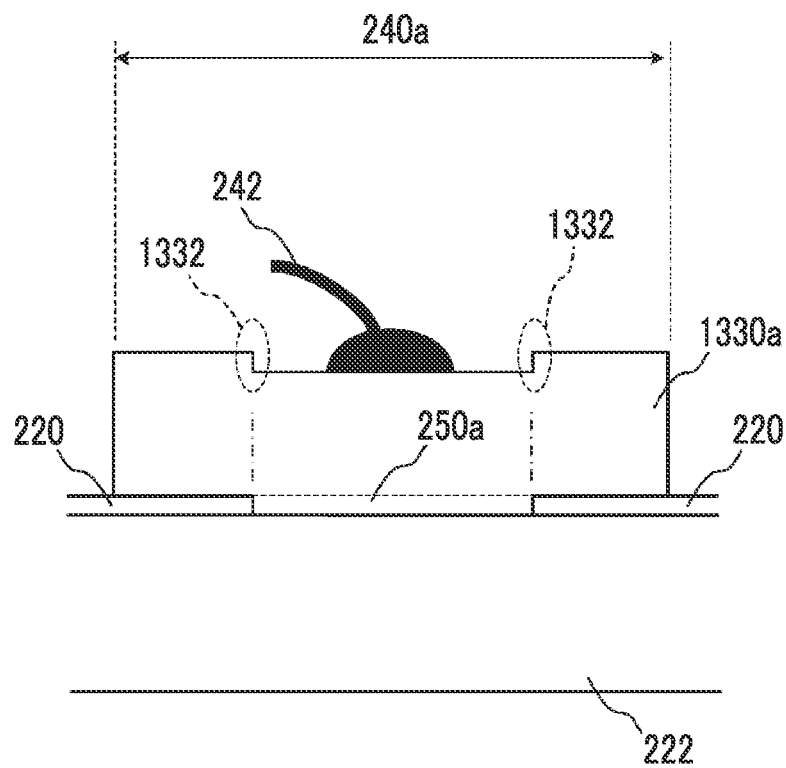
FIG. 15 is a diagram illustrating a first modification example of a conductor pattern.
Figure 16:
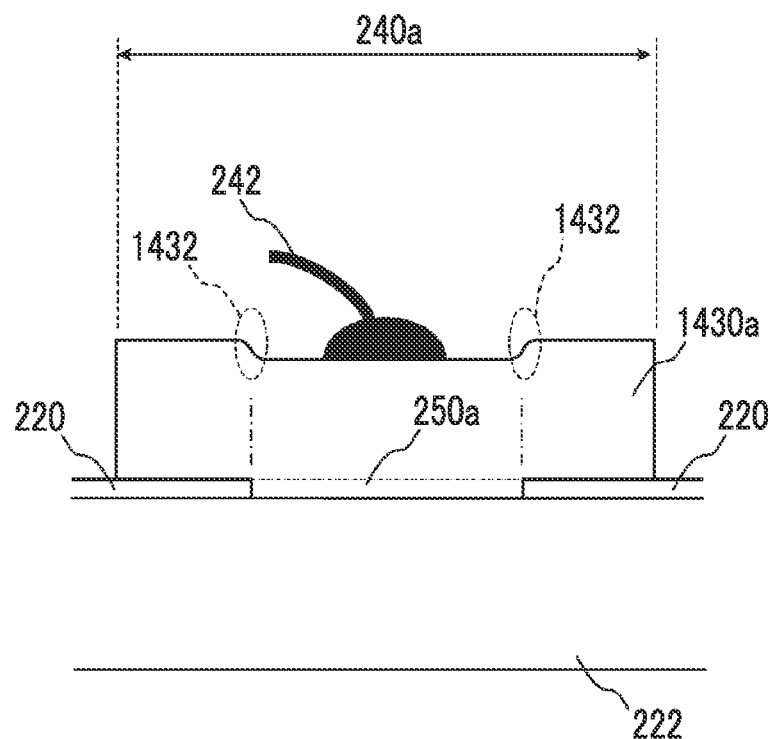
FIG. 16 is a diagram illustrating a second modification example of the conductor pattern.

FIGS. 15 and 16 are diagrams illustrating first and second modification examples of the conductor pattern 230. Conductor patterns 1330a and 1430a illustrated in FIGS. 15 and 16 have the same configuration as that of the conductor pattern 230a, but are different in that two boundary portions 1332 and 1432 (both are within dotted ellipses in the figure) that are portions corresponding to positions of the left and right boundaries of the substrate removal portion 250a in the figure have steps. Here, in the boundary portion 1332, the step has a bent portion in the sectional view of FIG. 15, whereas in the boundary portion 1432, the step is formed of a curved line in the sectional view of FIG. 16.

Since the conductor patterns 1330a and 1430a as illustrated in FIGS. 15 and 16 have the steps at portions corresponding to the boundaries of the substrate removal portion 250, when electrical connection to the electrical connection area 240*a* is performed, for example, when the metal wire 242 is bonded, a position of the substrate removal portion 250*a* can be visually recognized by referring to the steps formed at the boundary portions 1332 and 1432 of the conductor patterns 1330*a* and 1430*a*. Therefore, the electrical connection can be accurately performed at the position of the portion of the electrical connection area 240*a* in the substrate removal portion 250*a*.

The present invention is not limited to the configurations of the above-described embodiment and modification examples thereof, and may be implemented in various aspects without departing from the concept thereof.

For example, in the present embodiment, as an optical waveguide element, the optical modulation element 102 provided with the optical waveguide 224 forming a single Mach-Zehnder optical waveguide including a pair of parallel waveguides 226*a* and 226*b* on an optical substrate 220 that is an LN substrate has been described, but an optical waveguide device to which the present invention is applied is not limited to this.

In the optical waveguide element, a material other than LN that is thin enough to cause mechanical breakage such as cracking during electrical connection may be used for an optical substrate.

Figure 17:
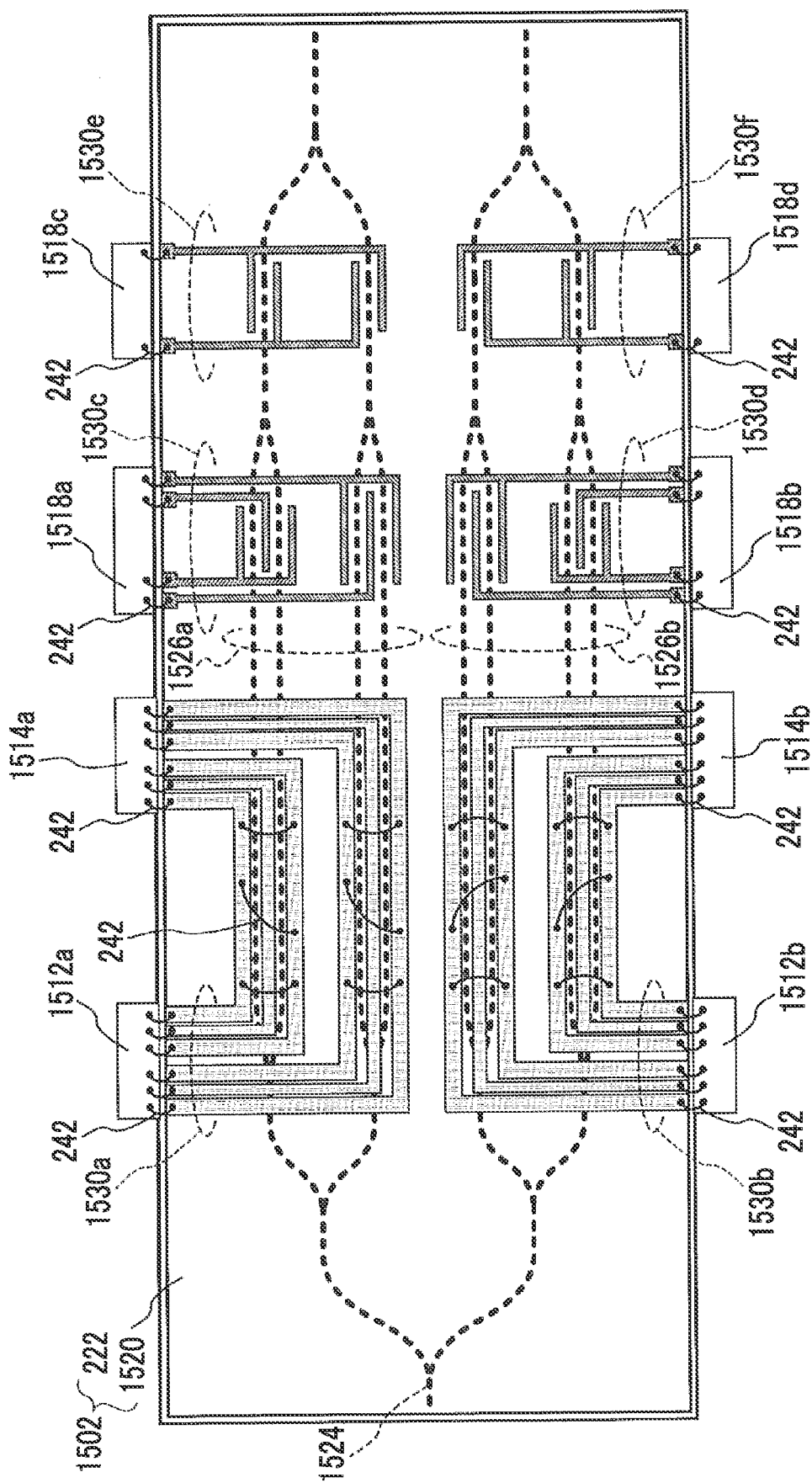
FIG. 17 is a diagram illustrating another example of the optical modulation element according to the present invention.

The optical waveguide element on which the substrate removal portion according to the present invention is formed uses an LN substrate as an optical substrate as in the present embodiment, and an optical waveguide element provided with an optical waveguide having a more complicated structure may be used. For example, an optical modulation element 1502 that performs DP-QPSK modulation and is configured by using two so-called nested Mach-Zehnder optical waveguides as illustrated in FIG. 17 may be used as the optical waveguide element.

The optical modulation element 1502 includes, for example, an optical substrate 1520 that is an LN substrate similar to the optical substrate 220, and a support substrate 222 bonded to the optical substrate 1520. An optical waveguide 1524 is formed on the optical substrate 1520. Here, the optical waveguide 1524 is formed of two so-called nested Mach-Zehnder optical waveguides, and includes two parallel waveguide groups 1526*a* and 1526*b* each including four parallel waveguides included in the two nested Mach-Zehnder optical waveguides.

Conductor patterns 1530*a*, 1530*b*, 1530*c*, 1530*d*, 1530*e*, and 1530*f* (hereinafter collectively referred to as conductor patterns 1530) are formed on the optical substrate 1520. Here, the conductor patterns 1530*a* and 1530*b* are signal electrodes for respectively controlling optical waves propagating through the parallel waveguide groups 1526*a* and 1526*b*, and the conductor patterns 1530*c*, 1530*d*, 1530*e* and 1530*f* are bias electrodes.

In the same manner as the conductor pattern 230 of the optical modulation element 102 that is the optical waveguide element according to the above-described embodiment, the conductor pattern 1530 includes at least one electrical connection area defined as a range in which electrical connection is performed by using, for example, the metal wire 242. Here, a portion of the electrical connection using the metal wire 242 is indicated by a black circle at the end of the metal wire 242 in FIG. 17. In FIG. 17, in order to avoid redundant description and facilitate understanding, all the metal wires are not given the reference numeral 242. The same figure as the figure with reference numeral 242 indicates the metal wire 242, and the black circle at the end of each metal wire illustrated on the optical substrate 1520 is a portion where the electrical connection area is defined.

In the same manner as in the optical modulation element 102, in the optical modulation element 1520, the optical substrate 1520 may have a substrate removal portion in which a material of the optical substrate has been removed to penetrate through the optical substrate 1520 at a portion corresponding to the electrical connection area, and at least a part of the electrical connection area may be formed on the support substrate 222 via the substrate removal portion.

In the optical modulation element 1502 illustrated in FIG. 17, light input to the optical waveguide 1524 from the left side in the figure is output from the right side in the figure as two QPSK-modulated output light beams. The two output light beams are polarized and combined by an appropriate space optical system according to a technique of the related art, converges into one light beam, coupled with, for example, an optical fiber, and guided to a transmission channel optical fiber.

In the above-described embodiment, the electrical connection used for the electrical connection area 240 is assumed to be electrical connection with a metal wire, but the present invention is not limited to this. The electrical connection may be, for example, connection with a conductor wire other than the metal wire, a conductor ribbon including a metal ribbon, or a solder bump in flip-chip bonding, depending on the type. Since such connection require a stronger pressure for the connection than when wires are used, the configuration of the present application can be more preferably applied.

In the above-described embodiment, the contact size is a circle with the diameter of 40 μm, but the contact size is not limited to this. The contact size may be another size or another shape depending on the type of electrical connection used for the electrical connection area 240.

As described above, the optical modulation element 102 that is the optical waveguide element described in the present embodiment includes the optical substrate 220 on which the optical waveguide 224 and the conductor pattern 230 are formed, and the support substrate 222 that supports the optical substrate 220. The conductor pattern 230 includes at least one electrical connection area 240 defined as a range in which electrical connection is performed. The optical substrate 220 has the substrate removal portion 250 in which a material of the optical substrate 220 has been removed to penetrate through the optical substrate 220 at a portion corresponding to the electrical connection area 240. At least a part of the electrical connection area 240 is formed on the support substrate 222 via the substrate removal portion 250.

According to this configuration, for example, when the metal wire 242 is bonded to the electrical connection area 240, the welding pressure applied to the electrical connection area 240 by a capillary of a wire bonder is not applied to the thinly processed optical substrate 220, and is applied to the support substrate 222 via the substrate removal portion 250. Therefore, the optical modulation element 102 can prevent the occurrence of cracks in the optical substrate 220 during electrical connection to the conductor pattern 230 on the optical substrate 220, and can thus prevent a connection failure and a reduction in manufacturing yield.

In the optical modulation element 102, a thickness of the optical substrate 220 is 10 μm or less. According to this configuration, for example, in an optical waveguide element formed of a rib-type optical waveguide formed on a thinly processed optical substrate 220, it is possible to prevent the occurrence of cracks on the optical substrate 220 and thus to prevent a connection failure and a reduction in manufacturing yield. In the above description, the thickness of the optical substrate has been described as 10 μm or less, but in a case of 5 μm or less, the above effect can be more achieved, and in a case of 2 μm or less, the effect can be further achieved.

In the optical modulation element 102, for example, the electrical connection area 240c is a rectangular electrical connection pad formed as a part of the conductor pattern 230a, and the conductor pattern 230a includes the line portions 230a-1 connected to the electrical connection area 240c that is an electrical connection pad. The electrical connection area 240c that is an electrical connection pad has the larger width W2 measured in the same direction as that of the line width W1 than the line width W1 of the line portion 230a-1 close to the electrical connection area 240c. At least a part of the electrical connection area 240c that is the electrical connection pad is formed on the support substrate 222 via the substrate removal portion 250c. The substrate removal portion 250c is disposed such that the boundary 250c-1 with the other portion of the optical substrate 220 is not formed under the line portion 230a-1.

According to this configuration, it is possible to prevent the occurrence of disconnection or the like of the line portion 230a-1.

In the optical modulation element 102, the substrate removal portion 250 is formed in a size including at least a circle with the diameter of 40 μm. According to this configuration, even in a case where electrical connection to the electrical connection area 240 is performed through wire bonding, it is possible to effectively avoid pressurization to the optical substrate 220 due to a capillary of a wire bonder.

In the optical modulation element 102, for example, the substrate removal portion 250c is formed to have an opening at the outer edge of the optical substrate 220. According to this configuration, a structure of the outer edge portion of the optical substrate 220 that is prone to cracking or chipping can be simplified, and the mechanical strength at the outer edge portion can be ensured.

In the optical modulation element 102, as the conductor patterns, the conductor patterns 1330a and 1430a having steps at the locations of the boundary portions 1332 and 1432 corresponding to boundaries between the substrate removal portion 250 and the other portion of the optical substrate 220 may be used. According to this configuration, when electrical connection to the electrical connection area 240a is performed, for example, when the metal wire 242 is bonded, a position of the substrate removal portion 250a can be visually recognized on the basis of the steps formed at the boundary portions of the conductor pattern 230, and thus the electrical connection can be performed accurately at a position of a portion of the electrical connection area 240a in the substrate removal portion 250a.

In the optical modulation element 102, at least two electrical connection areas 240 may be formed on the support substrate 222 via one substrate removal portion 250. According to this configuration, the number of substrate removal portions 250 provided on the optical substrate 220 can be reduced, processing steps of the optical substrate 220 can be simplified, and the cost can be reduced.

In the optical modulation element 102, the conductor pattern 230 includes, for example, the conductor pattern 230a that is a signal conductor pattern through which an electrical signal propagates, and for example, the conductor patterns 230b and 230c that are ground conductor patterns connected to a ground potential. The at least two electrical connection areas 240 may include an electrical connection area (for example, electrical connection area 240c) of at least one signal conductor pattern and an electrical connection area (for example, the electrical connection area 240e and/or the electrical connection area 240f) of at least one ground conductor pattern.

According to this configuration, it is possible to prevent cracking or chipping of the portion of the optical substrate 220 between the two substrate removal portions 250, which may occur in a case where the two substrate removal portions 250 are provided adjacent to each other separately for two electrical connection areas such as a signal conductor pattern and a ground conductor pattern forming a signal line, which are easily disposed to be arranged in close proximity to each other.

In the optical modulation element 102, the substrate removal portion 250 may be formed such that a boundary of the substrate removal portion 250 with the other portion of the optical substrate 220 does not include a bent portion. According to this configuration, the substrate removal portion can improve the mechanical stability of the optical substrate 220 because the boundary of substrate removal portion does not include a bent portion on which stress generated due to processing strain or a variation in environmental temperature is likely to concentrate.

In the optical modulation element 102, the substrate removal portion 250 may be formed to include a portion of the support substrate 222 in which the conductor pattern 230 is not formed in a range on the support substrate 222 that can be visually recognized through the substrate removal portion 250. According to this configuration, when electrical connection to the electrical connection area 240a is performed, for example, when the metal wire 242 is bonded, a position of the substrate removal portion 250a can be visually recognized, and thus the electrical connection can be performed accurately at a position of a portion of the electrical connection area 240a in the substrate removal portion 250a.

In the optical modulation element 102, the electrical connection area 240 is electrically connected to another electrical connection area 240 via, for example, the metal wire 242 that is a conductor disposed outside the optical substrate 220. According to this configuration, electrical connection between the conductor patterns 230 in the optical substrate 220 can be freely performed without worrying about damage to the optical substrate 220, and thus the degree of freedom in designing the optical modulation element 102 can be improved.

In the optical modulation element 102, in addition to a conductor wire such as the metal wire 242, a conductor ribbon or a solder bump may be connected to the electrical connection area 240. According to this configuration, various conductors can be used to perform electrical connection to the conductor pattern 230 while preventing the optical substrate 220 from being damaged.

The optical modulation device 100 that is an optical waveguide device according to the present embodiment has the optical modulation element 102 that is any of the above optical waveguide elements, and the housing that houses the optical modulation element. According to this configuration, a probability of occurrence of damage to the optical substrate 220 can be reduced and electrical connection with a high manufacturing yield can be performed, and thus an inexpensive and highly reliable optical waveguide device can be stably produced.

REFERENCE SIGNS LIST

100 Optical modulation device
102, 1502 Optical modulation element

104 Housing
106 Input optical fiber
108 Output optical fiber
110 Connector
112, 112', 115, 118, 1512a, 1512b, 1518a, 1518b, 1518c, 1518d Relay substrate
114, 1514a, 1514b terminator
116, 117 Lead pin, 119 Photodetector
220, 1520 Optical substrate
222 Support substrate
224, 1524 Optical Waveguide
226a, 226b Parallel waveguide
230, 230a, 230b, 230c, 230d, 230e, 1330a, 1430a, 1530a, 1530b, 1530c, 1530d, 1530e, 1530f Conductor pattern
230a-1 Line portion
230a-2 Transition pattern
240, 240a, 240b, 240c, 240d, 240e, 240f, 240g, 240h, 240j, 240k, 240m, 240n, 240p, 240q, 240r, 240s, 240t, 240u, 240v, 240w, 240y1, 240y2, 240z1, 240z2 Electrical connection area
242 Metal wire
243 Solder bump
250, 250a, 250b, 250c, 250d, 250g, 250h, 250m, 250n, 250p, 250q, 250r, 250s, 250t, 250u, 250v, 250w, 250y1, 250y2, 250z1, 250z2, 1050g, 1150g, 1250a Substrate removal portion
250c-1 Boundary
1332, 1432 Boundary portion
1526a, 1526b Parallel waveguide group.

The invention claimed is:

1. An optical waveguide element comprising:
an optical substrate on which an optical waveguide and a conductor pattern are formed; and
a support substrate that supports the optical substrate, wherein
the conductor pattern includes at least one electrical connection area defined as a range in which electrical connection is performed,
the optical substrate has a substrate removal portion in which a material of the optical substrate has been removed to penetrate through the optical substrate at a portion corresponding to the electrical connection area,
at least a part of the electrical connection area is formed on the support substrate via the substrate removal portion,
wherein the electrical connection area is an electrical connection pad configured as a part of the conductor pattern,
the conductor pattern includes a line portion connected to the electrical connection pad,
the substrate removal portion is formed to have an opening at an outer edge of the optical substrate.

2. The optical waveguide element according to claim 1, wherein
a thickness of the optical substrate is 10 µm or less.

3. The optical waveguide element according to claim 1, wherein
the electrical connection pad is rectangular,
the electrical connection pad is formed to have a width larger than a line width of the line portion close to the electrical connection pad, the width being measured in the same direction as a direction of the line width, and
at least a part of the electrical connection pad is formed on the support substrate via the substrate removal portion, and the substrate removal portion is disposed such that its boundary with another portion of the optical substrate is not formed under the line portion.

4. The optical waveguide element according to claim 1, wherein
the substrate removal portion is formed in a size including at least a circle having a diameter of 40 µm.

5. The optical waveguide element according to claim 1, wherein
the conductor pattern is formed to have a step at a portion corresponding to a boundary between the substrate removal portion and another portion of the optical substrate.

6. The optical waveguide element according to claim 1, wherein
at least two electrical connection areas are formed on the support substrate via one substrate removal portion.

7. The optical waveguide element according to claim 6, wherein
the conductor pattern includes a signal conductor pattern through which an electrical signal propagates and a ground conductor pattern that is connected to a ground potential, and
the at least two electrical connection areas include the electrical connection area of at least one signal conductor pattern and the electrical connection area of at least one ground conductor pattern.

8. The optical waveguide element according to claim 1, wherein
the substrate removal portion is formed in a shape in which its boundary with another portion of the optical substrate does not include a bent portion.

9. The optical waveguide element according to claim 1, wherein
the substrate removal portion is formed to include a portion in which the conductor pattern is not formed in a range of the support substrate that is visually recognizable through the substrate removal portion.

10. The optical waveguide element according to claim 1, wherein
the electrical connection area is electrically connected to another electrical connection area via a conductor disposed outside the optical substrate.

11. An optical waveguide device comprising:
the optical waveguide element according to claim 1; and
a housing that houses the optical waveguide element.

12. The optical waveguide element according to claim 2, wherein
the electrical connection pad is rectangular,
the electrical connection pad is formed to have a width larger than a line width of the line portion close to the electrical connection pad, the width being measured in the same direction as a direction of the line width, and
at least a part of the electrical connection pad is formed on the support substrate via the substrate removal portion, and the substrate removal portion is disposed such that its boundary with another portion of the optical substrate is not formed under the line portion.

13. The optical waveguide element according to claim 2, wherein
the substrate removal portion is formed in a size including at least a circle having a diameter of 40 µm.

14. The optical waveguide element according to claim 2, wherein
the conductor pattern is formed to have a step at a portion corresponding to a boundary between the substrate removal portion and another portion of the optical substrate.

15. The optical waveguide element according to claim 2, wherein at least two electrical connection areas are formed on the support substrate via one substrate removal portion.

16. The optical waveguide element according to claim 15, wherein
the conductor pattern includes a signal conductor pattern through which an electrical signal propagates and a ground conductor pattern that is connected to a ground potential, and
the at least two electrical connection areas include the electrical connection area of at least one signal conductor pattern and the electrical connection area of at least one ground conductor pattern.

17. The optical waveguide element according to claim 2, wherein
the substrate removal portion is formed in a shape in which its boundary with another portion of the optical substrate does not include a bent portion.

18. The optical waveguide element according to claim 2, wherein
the substrate removal portion is formed to include a portion in which the conductor pattern is not formed in a range of the support substrate that is visually recognizable through the substrate removal portion.

* * * * *